US008406364B2

(12) United States Patent
Hasegawa

(10) Patent No.: US 8,406,364 B2
(45) Date of Patent: Mar. 26, 2013

(54) FRACTIONAL FREQUENCY DIVIDER PLL DEVICE AND CONTROL METHOD THEREOF

(75) Inventor: Morihito Hasegawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 828 days.

(21) Appl. No.: 12/034,348

(22) Filed: Feb. 20, 2008

(65) Prior Publication Data

US 2008/0198959 A1 Aug. 21, 2008

(30) Foreign Application Priority Data

Feb. 20, 2007 (JP) ................................. 2007-038830

(51) Int. Cl.
 *H03D 3/24* (2006.01)
(52) U.S. Cl. ........ 375/376; 375/373; 375/374; 375/375; 327/115; 327/146; 327/147; 327/148
(58) Field of Classification Search .................. 375/376; 331/16, 18; 327/115, 147
See application file for complete search history.

(56) References Cited

U.S. PATENT DOCUMENTS

| 5,079,521 | A | 1/1992 | Gaskell et al. |
| 5,305,362 | A | 4/1994 | Miller |
| 6,236,703 | B1 | 5/2001 | Riley |
| 6,668,035 | B2 | 12/2003 | Han et al. |
| 6,707,855 | B2 * | 3/2004 | Patana ........................... 375/244 |
| 7,647,033 | B2 * | 1/2010 | Uozumi et al. ................ 455/260 |
| 2003/0137359 | A1 * | 7/2003 | Patana ........................... 331/100 |
| 2007/0001776 | A1 * | 1/2007 | Li .................................. 332/127 |

FOREIGN PATENT DOCUMENTS

| JP | 6-244721 A | 9/1994 |
| JP | 2002-152044 A | 5/2002 |
| JP | 2004-080404 A | 3/2004 |
| JP | 2005-175780 A | 6/2005 |
| JP | 2006-101168 A | 4/2006 |
| JP | 2006-229921 A | 8/2006 |

OTHER PUBLICATIONS

Japanese Office Action mailed May 31, 2011 for corresponding Japanese Application No. 2007-038830, with English-language Translation.

* cited by examiner

*Primary Examiner* — Daniel Washburn
*Assistant Examiner* — Eboni Hughes
(74) *Attorney, Agent, or Firm* — Fujitsu Patent Center

(57) ABSTRACT

In the following B cycles, the second frequency-divided signal fA is maintained at a low level, while the third frequency-divided signal fB is maintained at a high level. The three-modulus prescaler 13 has a frequency division value (M−1) if the pseudo random values are negative values, and a frequency division value (M+1) if the pseudo random values are positive values, in accordance with the signs of the pseudo random values outputted from the ΣΔ modulator 8. After that, the frequency division value becomes M. A frequency division value of (MN+A+Bx) including the pseudo random value Bx is obtained in the comparison frequency divider 4. A fractional frequency division operation can be realized through ΣΔ modulation by using the pseudo random numbers including negative values, as they are.

12 Claims, 6 Drawing Sheets

CIRCUIT BLOCK DIAGRAM SHOWING
AN EMBODIMENT OF THIS APPLICATION

CIRCUIT BLOCK DIAGRAM SHOWING
AN EMBODIMENT OF THIS APPLICATION

AN EXAMPLE OF A ΣΔ MODULATOR

VIEW SHOWING A PASCAL'S TRIANGLE

AN OUTPUT SIGNAL OF THE ΣΔ MODULATOR

| RANDOM VALUE | SIGN BIT (S) | NUMERICAL BIT SEQUENCE | |
|---|---|---|---|
| | | (D2) | (D1) |
| +4 | 1 | 0 | 0 |
| +3 | 1 | 1 | 1 |
| +2 | 1 | 1 | 0 |
| +1 | 1 | 0 | 1 |
| 0 | 0 | 0 | 0 |
| -1 | 0 | 0 | 1 |
| -2 | 0 | 1 | 0 |
| -3 | 0 | 1 | 1 |

FIG. 5 AN EXAMPLE OF A COMPARISON FREQUENCY DIVIDER
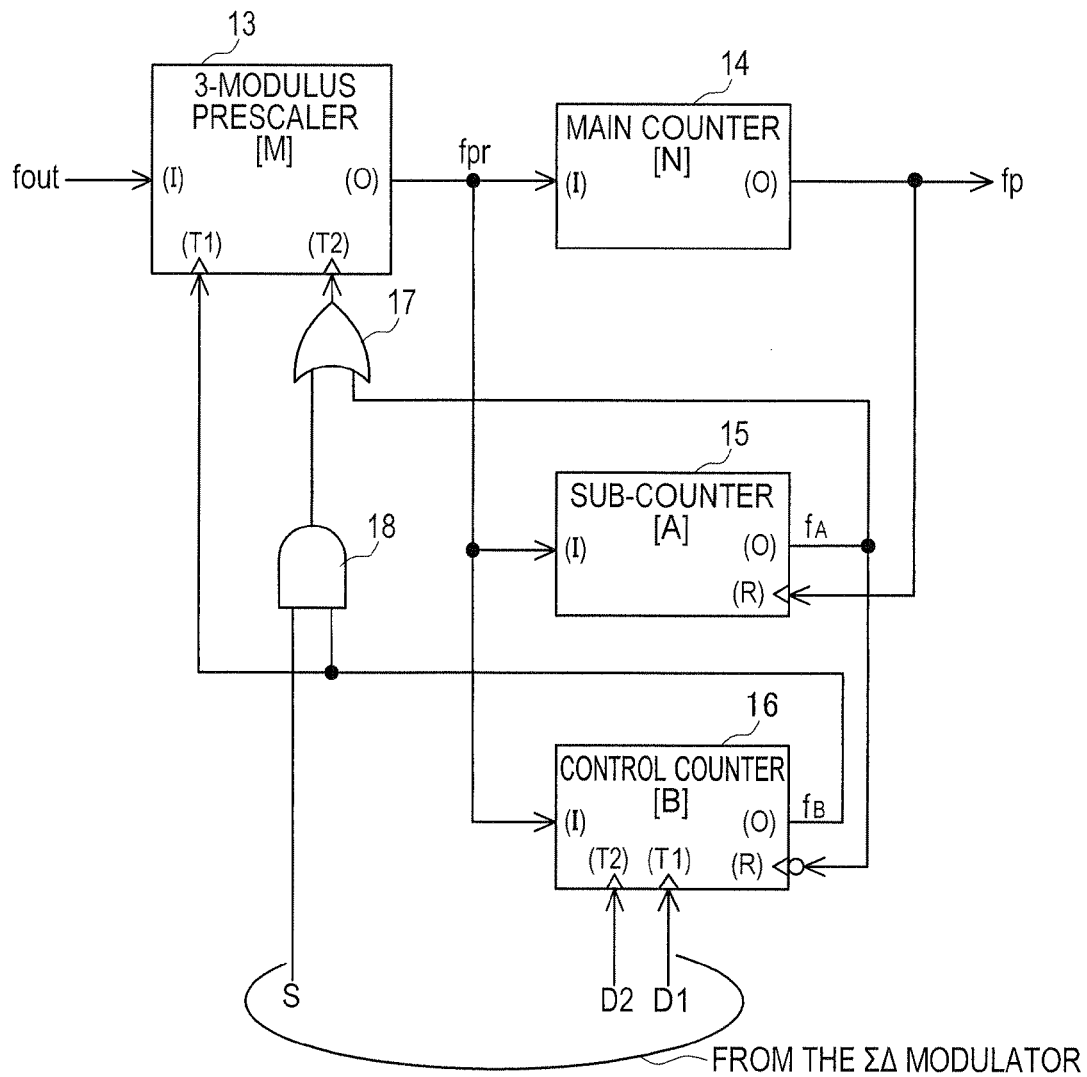
FIG. 6 VIEW SHOWING SETTINGS OF FREQUENCY DIVISION VALUES OF A 3-MODULUS PRESCALER
| X1 | X2 | FREQUENCY DIVISION VALUE |
|---|---|---|
| 0 | 0 | M |
| 0 | 1 | M+1 |
| 1 | 0 | M-1 |
| 1 | 1 | M+1 |

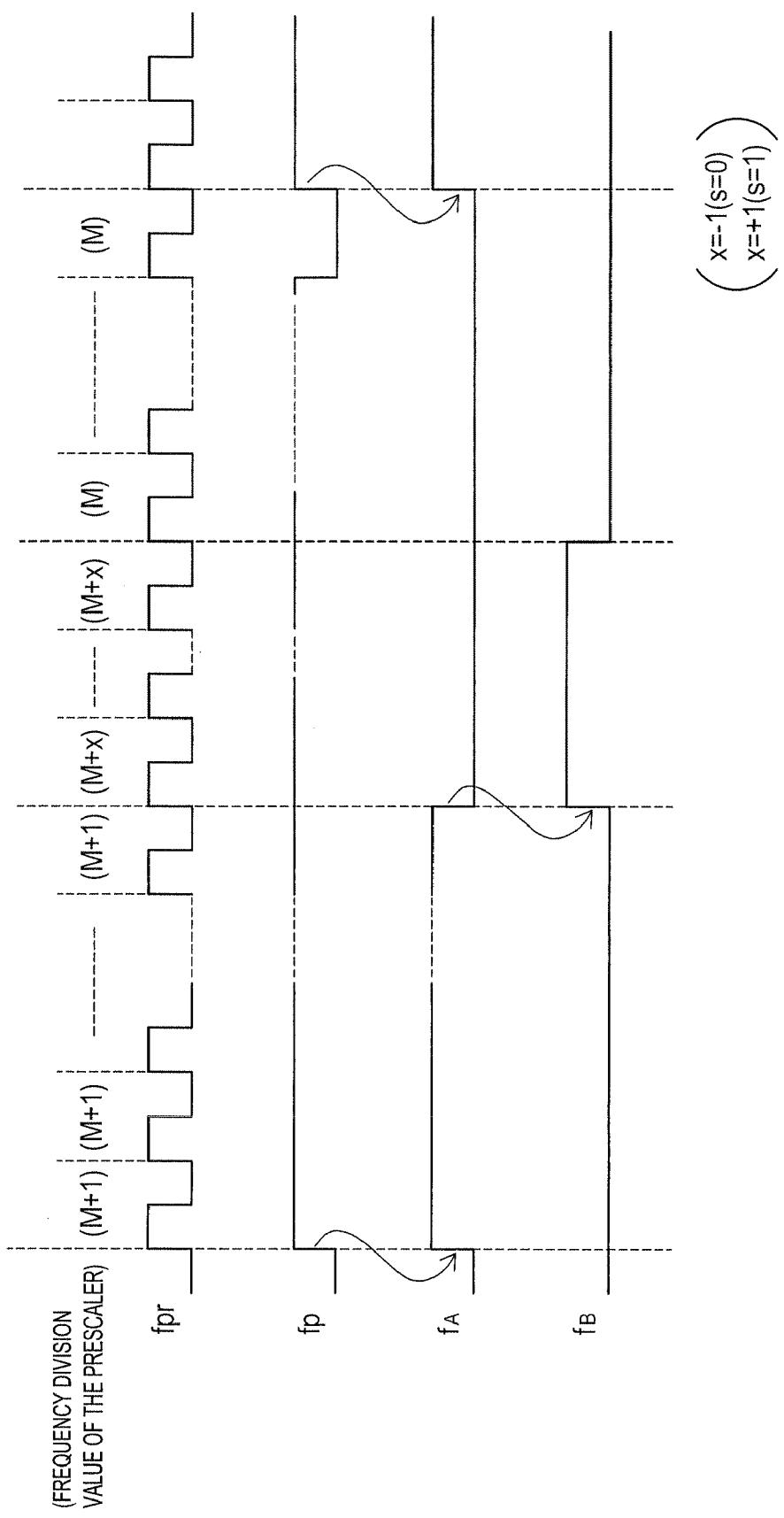

CIRCUIT BLOCK DIAGRAM OF BACKGROUND ART

FRACTIONAL FREQUENCY DIVIDER PLL DEVICE AND CONTROL METHOD THEREOF

CROSS-REFERENCE TO RELATED APPLICATIONS

This application is based upon and claims the benefit of priority from the prior Japanese Patent Application No. 2007-038830 filed on Feb. 20, 2007, the entire contents of which are incorporated herein by reference.

BACKGROUND

1. Field

This application relates to a fractional frequency divider PLL device employing $\Sigma\Delta$ modulation, more particularly, it relates to setting a frequency division value in response to an output signal outputted from a $\Sigma\Delta$ modulator.

2. Description of Related Art

A PLL circuit disclosed in Japanese Patent Publication No. 2004-80404 is shown in FIG. 8. The PLL circuit serves as a fractional NPLL frequency synthesizer (fractional frequency divider PLL device) in which a frequency division value of a comparison frequency divider that constitutes a PLL group is a fractional number.

A $\Sigma\Delta$ modulator 80 is fed a comparison signal fp. Then, the $\Sigma\Delta$ modulator 80 operates by employing the comparison signal fp as a clock signal, to output a Bit Stream of pseudo random numbers to an adder 90, as an output signal prs. For instance, if the $\Sigma\Delta$ modulator 80 has a three-order circuit configuration, the output signal prs becomes random numbers that vary between −3 through +4.

The adder 90 is fed a fixed frequency division value N. Then, the adder 90 adds the output signal prs to the fixed frequency division value N, and outputs the result to the comparison frequency divider 40. The comparison frequency divider 40 performs a frequency division operation using a frequency division value that varies between N−3 through N+4.

Here, the output signal prs outputted from the $\Sigma\Delta$ modulator 80 is random numbers including positive and negative values including value 0 thereinbetween. The frequency division value of the comparison frequency divider 40 is subjected to an arithmetic operation in accordance with this random number. In this case, if the output signal prs is random numbers of both positive and negative polarities, the arithmetic operations inevitably become complicated. This is due to the fact that both an addition operation and a subtraction operation are required depending on the random numbers. Here, adder 90 is provided and is adapted to add a fixed frequency division value N to the output signal prs. As a result, it becomes possible to input only positive values to the comparison frequency divider 40, which thus helps simplify arithmetic operations. The adder 90 has the role of shifting the random values of the output signal prs stretching over positive and negative values to non-negative random values, with the fixed frequency division value N used as an offset value.

SUMMARY

A fractional frequency divider PLL device and a control method thereof capable of reducing the number of parameters to be set to thus enhance convenience of use and help simplify circuit configuration are provided.

There is provided a fractional frequency divider PLL device equipped with a $\Sigma\Delta$ modulator that outputs pseudo random numbers that are a 0 value or positive or negative integer values and a mean value thereof is a predetermined fractional value, wherein the fractional frequency division PLL device comprises a three-modulus prescaler having a set frequency division value, a frequency division value −N and a frequency division value +N obtained by increasing or decreasing the set frequency division value by ±N, and a fractional frequency division control unit that instructs, to the three-modulus prescaler, the frequency division value −N if the pseudo random numbers are negative values, and instructs the frequency division value +N if the pseudo random numbers are positive values, during a period of time in which an output signal of the three-modulus prescaler is outputted in cycles corresponding to an absolute numerical value of the pseudo random numbers.

A control method of the fractional frequency divider PLL device according to the embodiment utilizing a $\Sigma\Delta$ modulation that outputs pseudo random numbers that are a 0 value or positive or negative integer values and a mean value thereof is a predetermined fractional value, wherein the control method comprises a step of setting a frequency division value of the three-modulus prescaler to a frequency division value obtained by subtracting frequency division by N from a set frequency division value, if the pseudo random numbers are negative values during a period of time when an output signal of the three-modulus prescaler is outputted in cycles corresponding to an absolute numerical value of the pseudo random numbers, and a step of setting the frequency division value of the three-modulus prescaler to a frequency division value obtained by adding frequency division by N to the set frequency division value, if the pseudo random numbers are positive values during a period of time in which an output signal of the three-modulus prescaler is outputted in cycles corresponding to the absolute numerical value of the pseudo random numbers.

The above and further novel features of the disclosure will more fully appear from the following detailed description when the same is read in connection with the accompanying drawings. It is to be expressly understood, however, that the drawings are for the purpose of illustration only and are not intended as a definition of the limits of the disclosure.

BRIEF DESCRIPTION OF THE DRAWINGS

FIG. 4 is a view showing an output signal of the $\Sigma\Delta$ modulator;

FIG. 5 is a view showing an example of a comparison frequency divider;

FIG. 6 is a view showing settings of frequency division values of a three-modulus prescaler;

FIG. 7 is a view showing an operation timing chart of the comparison frequency divider.

DETAILED DESCRIPTION OF THE PREFERRED EMBODIMENTS

An embodiment of a fractional frequency divider PLL device and a control method thereof according to this application will be described in detail hereinafter with reference to FIG. 1 through FIG. 7.

In recent years, PLL devices are being used in various fields focusing mainly on the wireless communication field in mobile communication and the like. More particularly, efficient use of carrier frequencies in the field of mobile communication such as portable phones, etc. constitutes a very important problem and may require switching between high-speed frequencies. This results in a demand to reduce a lock-up time which represents the frequency switching time. An excellent C/N characteristic is required to ensure proper communication quality and generation of spurious signals needs to be suppressed.

To address these demands, there is provided a fractional frequency divider PLL device employing ΣΔ modulation. As a result of using a fractional frequency dividing operation, a frequency division value is randomly changed through ΣΔ modulation, whereby the spurious suppression characteristic is improved, while a high-speed lock-up time characteristic is secured.

Figure 1:
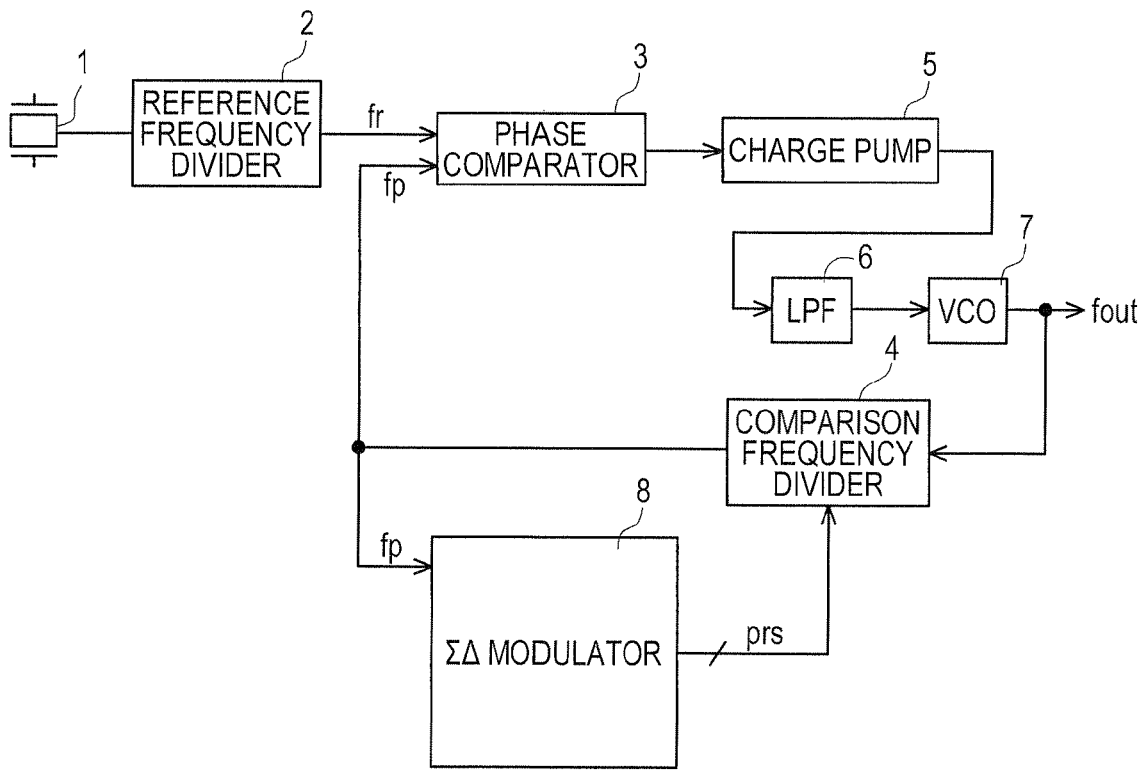
FIG. 1 is a circuit block diagram showing an embodiment of this application.

FIG. 1 shows an embodiment of the fractional frequency divider PLL device employing ΣΔ modulation according to this application. Oscillator 1 serves as an output circuit of a reference clock signal using a crystal oscillator or the like. The reference clock signal outputted from the oscillator 1 is inputted to a reference frequency divider 2. The reference frequency divider 2 is constituted of a counter circuit and is adapted to frequency-divide a reference clock signal in accordance with a predetermined frequency division value. The reference clock signal that was frequency-divided in the reference frequency divider 2 is outputted as reference signal fr, and is inputted to a phase comparator 3.

A comparison signal fp to be outputted from the comparison frequency divider 4 is further inputted to the phase comparator 3. The phase comparator 3 outputs a pulse signal corresponding to a frequency difference and a phase difference between the reference signal fr and the comparison signal fp, and outputs this signal to a charge pump circuit 5.

The charge pump circuit 5 outputs a voltage signal based on the pulse signal inputted thereto. The outputted voltage signal is inputted to a low-pass filter (LPF) 6. Here, the voltage signal outputted from the charge pump circuit 6 serves as a signal in which a pulse component is superimposed on a direct current component. The direct current component changes with frequency fluctuations of the pulse signal, and the pulse component changes based on the phase difference of the pulse signal.

The low-pass filter (LPF) 6 smoothes the voltage signal inputted thereto to output a signal whose high-frequency component was removed to a voltage-controlled oscillator (VCO) 7. The voltage-controlled oscillator (VCO) 7 converts the signal inputted thereto into a signal having a frequency corresponding to the signal voltage, and outputs the result as an output signal fout. The output signal fout is outputted to an external circuit and to a comparison frequency divider 4.

The comparison frequency divider 4 has a circuit configuration as will be described later with reference to FIG. 5. The frequency division value is adjusted in accordance with the output signal prs outputted from the ΣΔ modulator 8 as pseudo-random numbers. The comparison frequency divider 4 performs frequency division on the output signal fout inputted thereto based on the adjusted frequency division value, and outputs a comparison signal fp.

The ΣΔ modulator 8 is fed the comparison signal fp, and performs a ΣΔ modulation operation using the comparison signal fp as a clock signal. The output signal prs to be outputted from the ΣΔ modulator 8 serves as a signal showing pseudo-random numbers, including signs. The signal has a bit width corresponding to the circuit degree constituting the ΣΔ modulator 8. For instance, if the ΣΔ modulator 8 has a 3-degree circuit configuration, the pseudo-random numbers to be outputted have a range between −3 through +4. The output signal prs is configured by one-bit sign bit S and 2-bit numerical bit sequence D1 and D2.

In the fractional frequency divider PLL device (FIG. 1) of the embodiment, the output signal prs including signs and outputted from the ΣΔ modulator 8 is inputted directly to the comparison frequency divider 4, whereby the frequency division value is adjusted. The random values to be inputted to the comparison frequency divider 4 need not be random values that do not include negative values obtained by imparting offset values.

Figures 2, 3:
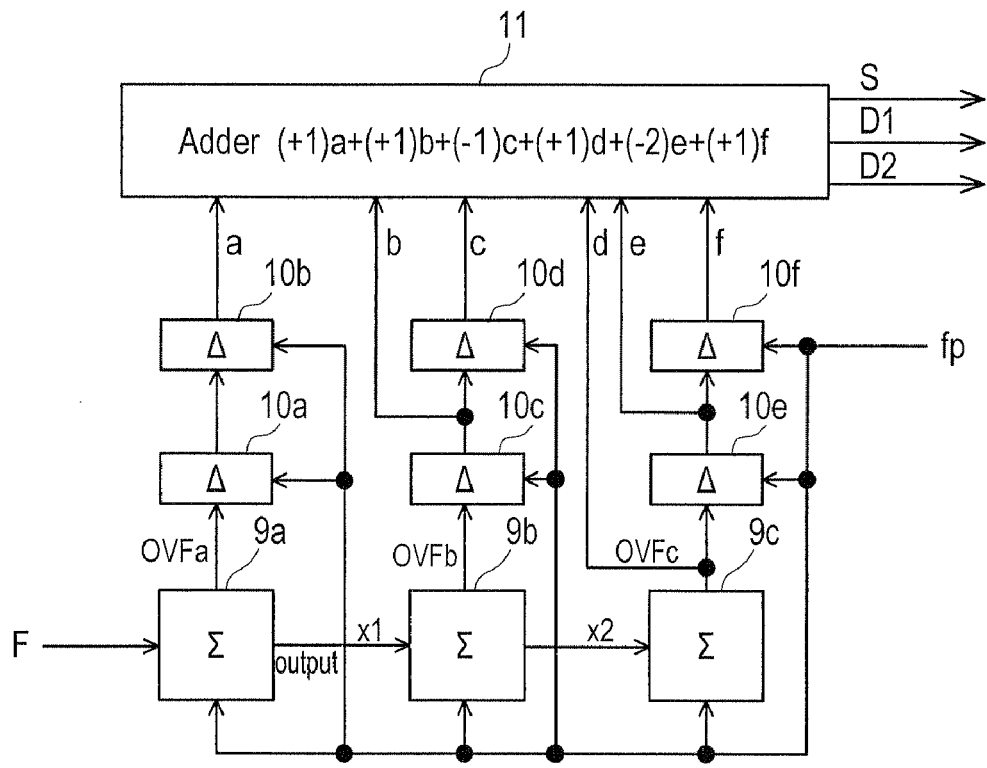
FIG. 2 is a circuit block diagram showing an example of a $\Sigma\Delta$ modulator.
FIG. 3 is a view showing a Pascal's triangle.
Figure 8:
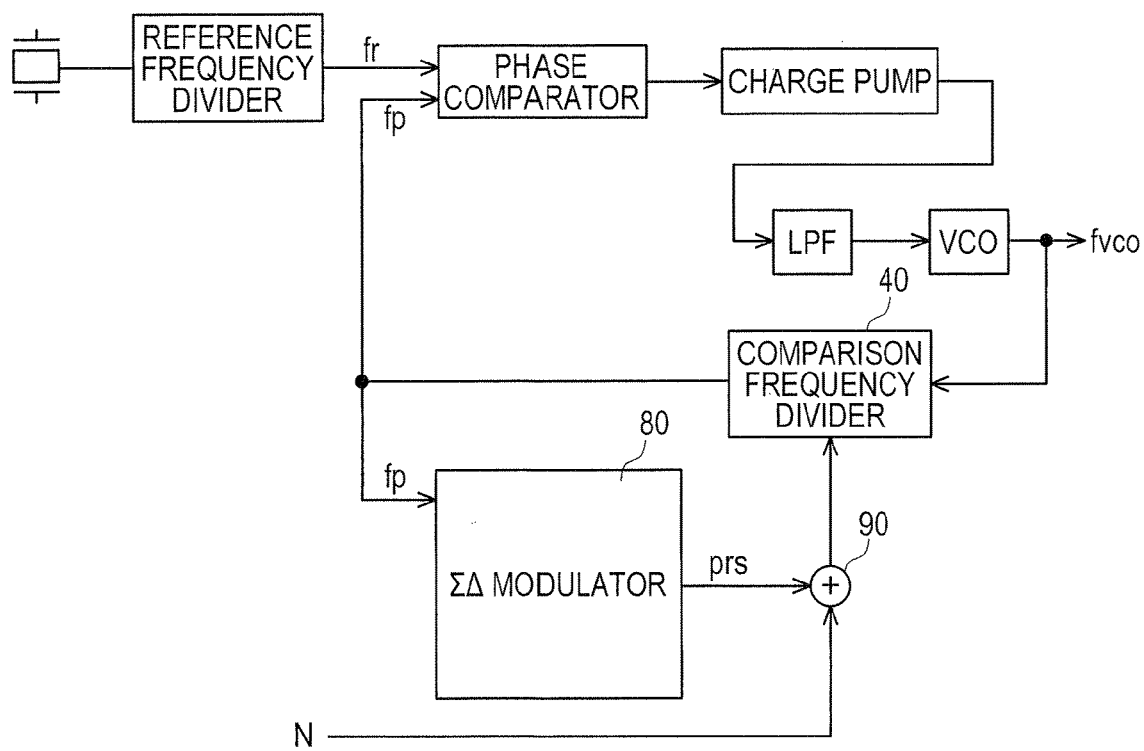
FIG. 8 is a circuit block diagram of background art.

FIG. 2 shows an example of the ΣΔ modulator 8. This represents an example of the 3-order circuit configuration. The ΣΔ modulator 8 is constituted of three integrators 9a through 9c, six differentiators 10a through 10f, and an adder 11.

A numerator value F of the ΣΔ modulator 8 is inputted from an external device not shown to the integrator 9a. The integrator 9a accumulates the input values F based on the clock signal fp, and when its accumulated value becomes larger than a denominator value (modulo value) Q, it outputs an over-flow signal OVFa. After over-flow, the integrator 9a subtracts the denominator value Q from the accumulated value and continues accumulation of input values F.

The denominator value (modulo value) Q is a numerical value represented by an n-bit bit sequence constituting the integrator 9a and is set at 2n. The numerator value F is inputted by a (n−1)-bit digital signal with respect to a power number n of the denominator value Q. The denominator values Q of integrators 9a through 9c are identical values. For instance, if the integrators 9a through 9c are configured by 23 bits (n=23), Q=$2^{23}$=8388608, meaning that the numerator value F is configured by 22 bits.

The over-flow signal OVFa of the integrator 9a is supplied to adder 11 as an input signal a, through differentiators 10a and 10b. Also, the accumulated value X1 of integrator 9a is supplied to the integrator 9b.

Integrator 9b carries out an accumulation operation using the accumulated value X1 as an input signal, and supplies an accumulated value X2 to integrator 9c. The over-flow signal OVFb to be outputted from the integrator 9b is supplied to the adder 11 as an input signal b, through the differentiator 10c, and to adder 11 as an input signal c, through the differentiators 10c and 10d.

Integrator 9c performs an accumulation operation using the accumulated value X2 as an input signal, and outputs an over-flow signal OVFc. The over-flow signal OVFc is supplied to adder 11 as an input signal d, to adder 11 as an input signal e through differentiator 10e and to adder 11 as input signal f through differentiators 10e and 10f.

Differentiators 10a, 10b and 10c are inserted to correct a shift in timing between the respective input signals a through f caused by the operation in the differentiators 10d, 10e and 10f in accordance with the clock signal fp.

Adder 11 performs an arithmetic operation (+1)a+(+1)b+(−1)c+(+1)d+(−2)e+(+1)f, based on the input signals a through f. This is outputted as a pseudo random number. The coefficients to be multiplied with the respective input signals a through f serve as coefficients that are set based on Pascal's triangle in FIG. 3. In the above arithmetic operation, an arithmetic operation is performed on integer values in the range −3 through +4. A mean value F/Q of these pseudo random numbers becomes a fractional value, a so-called MASH-type random number.

The output signal prs to be outputted from the adder 11 is configured by 1-bit sign bit S and 2-bit numerical bit sequence D1 and D2. From the pseudo random numbers subjected to an arithmetic operation based on the above expression, positive and negative signs are outputted as sign bit S, whereas numerical values are outputted as digital values in numerical bit sequence D1 and D2.

FIG. 4 is a table showing correspondences between the pseudo random values and the output signal prs. Here, S=0 is outputted with respect to negative values, and S=1 is outputted with respect to positive values. Also, (D2, D1)=(0,0), (0,1), (1,0), (1,1) are allocated with respect to numerical values 0 through 3. Further, (D2, D1)=(0,0) is allocated with respect to numerical value 4.

FIG. 5 shows an example of the comparison frequency divider 4. The output signal fout to be outputted from the voltage-controlled oscillator (VCO) 7 is inputted to the input terminal (I) of a three-modulus prescaler 13. In the three-modulus prescaler 13, any of three frequency division values comprising frequency division values (M±1) obtained by performing frequency division by ±1 starting from frequency division by M, wherein the frequency division value M is used as a reference setting frequency division value. The output signal fout inputted using the selected frequency division value is frequency-divided, and a first frequency-divided signal fpr is outputted from the output terminal (O).

The frequency division value selected in the three-modulus prescaler 13 is set in accordance with the signal inputted to the frequency division value set terminals (T1) and (T2). In other words, if the signal inputted to the frequency division value set terminals (T1) and (T2) is (0,0), a frequency division value M is selected, if the signal is (1,0), a frequency division value (M−1) is selected, and if the signal is (0,1) or (1,1), a frequency division value (M+1) is selected, as shown in FIG. 6.

A third frequency-divided signal fB to be described later is inputted to the frequency division value set terminal (T1). An output signal of an OR gate 17 is inputted to the frequency division value set terminal (T2). The output signal of the AND gate 18 and a second frequency-divided signal fA to be described later is inputted to the OR gate 17. In the output signal prs outputted from the ΣΔ modulator 8, sign bit S and the third frequency-divided signal fB to be described later are inputted to the AND gate 18.

A first frequency-divided signal fpr outputted from the three-modulus prescaler 13 is inputted to an input terminal (I) of a main counter 14, a sub-counter 15 and a control counter 16, respectively.

The main counter 14 counts N cycles of first frequency-divided signals fpr, and outputs a low level comparison signal fp from the output terminal (O). As a result, the first frequency-divided signal fpr is subjected to frequency division by N.

The sub-counter 15 is fed the comparison signal fp at its initialization terminal (R). Here, the initialization terminal (R) serves as a positive logical input. The count operation in this sub-counter is started in response to a high level comparison signal fp being outputted following the start-up of the count operation in the main counter 14. The sub-counter 15 counts A cycles of first frequency-divided signals fpr and outputs a low level second frequency-divided signal fA from its output terminal (O). As a result, the first frequency-divided signal fpr is subjected to frequency division by A. After the count of A, the second frequency-divided signal fA is maintained at a low level until the main counter 14 counts N cycles of first frequency-divided signals fpr.

The control counter 16 is fed the second frequency-divided signal fA at its initialization terminal (R). Here, the initialization terminal (R) serves as a negative logic input. A count operation of the control counter 16 is started in response to a low level second frequency-divided signal fA being outputted following completion of the count operation of A cycles of first frequency-divided signals fpr in the sub-counter 15. The control counter counts B cycles of first frequency-divided signals fpr, and outputs a low level third frequency-divided signal fB from the output terminal (O). As a result, the first frequency-divided signal fpr is subjected to frequency division by B. After the count of B, the third frequency-divided signal fB is maintained at a low level until the sub-counter 15 counts A cycles of first frequency-divided signals fpr to complete the count operation.

The control counter 16 is provided with set terminals (T1) and (T2). The 2-bit digital value to be inputted to the set terminals (T1) and (T2) is set as count value B. Here, the bit configuration of the control counter 16 is at least B bits. B=1, 2, 3 is set with respect to each of the 2-bit digital values (T2,T1)=(0,1), (1,0), (1,1) to be inputted to the set terminals (T1) and (T2). Here, numerical bit sequence D1 and D2 in the output signal prs outputted from the ΣΔ modulator 8 are inputted to the set terminals (T1) and (T2).

An operation timing chart of the comparison frequency divider 4 shown in FIG. 5 is shown in FIG. 7. The comparison frequency divider 4 in FIG. 5 uses the counting of N cycles of first frequency-divided signals fpr in the main counter 14 as a reference time, and repeats this to thus carry out a frequency division operation. FIG. 7 shows a timing chart of a reference time.

The comparison signal fp transits to a high level following start-up of a count operation of the first frequency-divided signals fpr in the main counter 14. Also, the second frequency-divided signal fA as well transits to a high signal in response to the transition of the comparison signal fp to a high level. The count operation continues in the main counter 14 until the count of N cycles of first frequency-divided signals fpr, and a low level comparison signal fp is outputted as a result. The count operation continues in the sub-counter 15 until the count of A cycles of first frequency-divided signals fpr. During this time, the second frequency-divided signal fA is maintained at a high level, and transits to a low level in response to A counts. The low level state of the second frequency-divided signal fA is maintained until N cycles of first frequency-divided signals fpr are counted by the main counter 14 and the comparison signal fp transits to a high level. Here, A counts is a number of counts smaller than N counts.

The count operation is started in the control counter 16 upon transition of the second frequency-divided signal fA outputted in response to the operation of counting A cycles of first frequency-divided signals fpr in the sub-counter 15, to a low level. The third frequency-divided signal fB transits to a high level upon start-up of the count operation and is maintained at a high level until B cycles of first frequency-divided signals fpr are counted. When B cycles are counted, the signal fB transits to a low level, and after that, the low level state of the third frequency-divided signal fB is maintained until A cycles of first frequency-divided signals fpr are counted in the sub-counter 15, and the resulting first frequency-divided signal fA transits to a low level. Here, B counts are a number of counts smaller than N counts. Further, the sum of the A counts and the B counts are a number of counts smaller than the N counts.

According to the above-described operation, in the reference time in which N cycles of first frequency-divided signals fpr are counted by the main counter 14, in the time period of the initial A cycles of the first frequency-divided signal fpr the second frequency-divided signal fA is maintained at a high level, and the third frequency-divided signal fB is maintained at a low level. The frequency division value set terminal (T1) of the three-modulus prescaler 13 is fed the third frequency-divided signal fB, and therefore is fed a low level, whereas the frequency division value set terminal (T2) of the three-modulus prescaler 13 is fed a high level by being fed a high level second frequency-divided signal fA through the OR gate 17. As a result, the three-modulus prescaler 13 selects the frequency division value (M+1), as shown in FIG. 6. In the initial A cycles of the first frequency-divided signal fpr, the output signal fout is subjected to frequency division by (M+1) and the resulting first frequency-divided signal fpr is outputted.

In B cycles following the initial A cycles, the second frequency-divided signal fA is a low level, while the third frequency-divided signal fB is a high level. The frequency division value set terminal (T1) of the three-modulus prescaler 13 is fed a high level, whereas the frequency division value set terminal (T2) of the three-modulus prescaler 13 is fed a low level or a high level in response to the sign bit S outputted by the OR gate 17 from the ΣΔ modulator 8. The third frequency-divided signal fB inputted to the AND gate 18 is a high level since a logic level that is in-phase with logic level of the sign bit S is inputted to the logic OR gate 17. If the pseudo random numbers outputted from the ΣΔ modulator 8 are negative values, a low level is inputted, and if they are positive values, a high level is inputted. As a result, in the three-modulus prescaler 13, a frequency division value (M−1) is selected in case of negative values, and a frequency division value (M+1) is selected in case of positive values, together with the signs of the pseudo random numbers outputted from the ΣΔ modulator 8, as shown in FIG. 6. The B cycles are a number of cycles corresponding to an absolute numerical value of the pseudo random numbers outputted from the ΣΔ modulator 8. Following the initial A cycles of the first frequency-divided signal fpr, during the time period of the B cycles corresponding to the absolute numerical value of the pseudo random numbers, the frequency division value is increased or decreased by ±1 from the frequency division by M in accordance with the signs of the pseudo random numbers, and the output signal fout is subjected to frequency division, whereby the first frequency-divided signal fpr is outputted.

In the remaining cycles following the B counts, the second frequency-divided signal fA and the third frequency-divided signal fB are both low level. At this time, the frequency division value set terminal (T1) of the three-modulus prescaler 13 is fed a low level, while the frequency division value set terminal (T2) of the three-modulus prescaler 13 is fed a low level, due to the fact that the output signal of the AND gate 18 is fixed to a low level and a low level is therefore inputted to the OR gate 17. As a result, the frequency division value M is selected in the three-modulus prescaler 13, as shown in FIG. 6. After A cycles and B cycles of the first frequency divider signal fpr, the output signal fout is subjected to frequency division by M and the resulting first frequency-divided signal fpr is then outputted.

As described in the above text, the frequency division value in the comparator frequency divider 4 becomes $$A(M+1)+B(M+x)+M(N-A-B)=MN+A+Bx$$

Here, x shows −1 or +1. This is a sign in the pseudo random numbers in which any one number is set according to sign bit S. B is an absolute numerical value of the pseudo random numbers set by the numerical bit sequence D1 and D2. In other words, Bx is a pseudo random number in itself. Accordingly, the frequency division value used by the comparator frequency divider 4 becomes a frequency division value obtained by adding a predetermined fractional value (F/Q) which is the mean value of the pseudo random numbers outputted from the ΣΔ modulator 8 to the frequency division value obtained by multiplying the frequency division value N set by the main counter 14 to the frequency division value A set in the sub-counter 15. The resulting frequency division value is subjected to fractional frequency division. Since the Bx that sets the fractional frequency division is given as a pseudo random number in each reference time, it is possible to obtain a characteristic of suppressing spurious signals.

In the technology disclosed in the Japanese Patent Publication 2004-80404, an offset value larger by N fixed fractional value is inputted to the comparator frequency divider 40 with respect to an original random value comprised in the output signal prs, which may cause a larger frequency division value than the intended frequency division value to be outputted. To cancel this offset value, the count setting value of the counter provided in the comparison frequency divider 40 must be adjusted to be lower by the amount of the offset value. Since the offset values to be adjusted in response to the modulation degree of the ΣΔ modulator 80 differ, the count value of the counter constituting the comparison frequency divider 40 must be adjusted each time, which becomes cumbersome.

Also, shifting the random values of the output signal prs requires additional circuitry such as adder 90 and a conversion circuit, and the like, which thus creates problems as far as simplification of circuit configuration and power consumption are concerned.

The fractional frequency divider PLL device of the embodiment of this application is equipped with a ΣΔ modulator which carried out a fractional frequency division operation by outputting pseudo random numbers which are a 0 value, positive integer values or negative integer values and a mean value thereof is a predetermined fractional value. In this case, the fractional frequency division control unit selects, with respect to the three-modulus prescaler switching between a set frequency division value, a frequency division value −N obtained by decreasing the set frequency division value by −N, and the frequency division value +N obtained by increasing the set frequency division value by +N, an output signal of the three-modulus prescaler in a number of cycles corresponding to the absolute numerical value of the pseudo random numbers, and instructs, to the three-modulus prescaler, frequency division value −N if the pseudo random numbers are negative values, and instructs the frequency division value +N if the pseudo random numbers are positive values.

In the control method of the fractional frequency division PLL device of the present embodiment according to this application, a fractional frequency division operation is carried out by using pseudo random numbers outputted from the ΣΔ modulator and which are a 0 value, positive integer values or negative integer values and a mean value thereof is a predetermined fractional value. In this case, during a period of time the output signal of the three-modulus prescaler is outputted in a number of cycles corresponding to the absolute numerical value of the pseudo random numbers, if the pseudo random numbers are negative values, the frequency division value of the three-modulus prescaler is set to a frequency division value obtained by subtracting frequency division by N from the set frequency division value, and if the pseudo random numbers are positive values, the frequency division value of the three-modulus prescaler is set to a frequency division value obtained by adding frequency division by N to the set frequency division value.

As a result, the frequency division value of the three-modulus prescaler is switched to the frequency division value −N or frequency division value +N with respect to the set frequency division value, in response to the value of the pseudo random numbers and the signs outputted from the ΣΔ modulator. Here, since the mean value of the pseudo random numbers is set to a predetermined fractional number, the frequency division value in the three modulus-prescaler in which the frequency division value is switched in response to the pseudo random numbers becomes a value obtained by multiplying the predetermined fractional value by N. Thus, a frequency division value corresponding to the predetermined fractional number can be obtained by using the pseudo random numbers as they are.

Since the pseudo random numbers can be used as they are, it is possible to provide a fractional frequency division PLL device and a control method thereof in which adjustment of additional parameters for a cancel operation of the offset value, which operation is required in the case that an offset value is imparted, is no longer necessary and whose circuit configuration can be simplified.

As was described in the above text, according to the embodiment of this application, when a fractional frequency division is realized in the ΣΔ modulator 8 by using pseudo random numbers, negative value pseudo random numbers outputted from the ΣΔ modulator 8 can be handled as they are, which thus enables a simple fractional frequency division to be carried out as compared to the case that an arithmetic operation is carried out on the frequency division value after an offset value is added to a negative value to convert it to a non-negative value. More specifically, since a circuit configuration of an adder or the like for adding the offset value is unnecessary and the offset value added to the pseudo random numbers is cancelled, cumbersome adjustments of circuit constants such as adjusting the count value (A counts) of the sub-counter 15 become unnecessary. It is thus possible to simplify circuit configuration and eliminate cumbersome activities such as adjusting circuit constants, and the like.

The disclosure is not limited to the above-described embodiment, and needless to say, various improvements and modifications thereof can be performed without departing from the scope of the embodiment.

For instance, although a description was given in the present embodiment of the case that in the comparison frequency divider 4, B counts are carried out by the control counter 16 following A counts carried out by the sub-counter 15, the disclosure is not limited to this. The counting operation by the sub-counter 15 and the counting operation by the control counter 16 must not overlap in the operation cycles of the first frequency-divided signal fpr. In other words, other than the case that the A count operation and the B count operation in the operation cycles of the first frequency-divided signal fpr are carried out in neighboring operation cycles, these counting operations may also be carried out in operation cycles that are spaced from one another.

Also, although a description was given of the ΣΔ modulator 8 having a three-order circuit configuration, the disclosure is not limited to this. The modulator can be similarly configured to have a two-order or four-order or higher-order circuit configuration. In this case, since the numerical bit sequence are increased or decreased in response to the above order, the bit width must be matched to the degree of the ΣΔ modulator 8 so as to obtain a bit configuration enabling the control counter to count the number of bits in the numerical bit sequence.

Also, although a description was given of the case that the sub-counter 15 is provided in the present embodiment, the disclosure is not limited to this. A configuration is also possible in which the sub-counter 15 is not provided. In this case, the frequency division value to be outputted is (MN+Bx).

Also, although a description was given of the case that the three-modulus prescaler 13 is provided with the frequency division values (M±1) in addition to the frequency division value M which is the reference set frequency division value, the disclosure is not limited to this. A frequency division value (M±N) (N being an integer equal to 2 or above) may also be provided.

What is claimed is:

1. A fractional frequency divider PLL device comprising:
   a ΣΔ modulator that outputs pseudo random numbers that are a 0 value, positive integer values, or negative integer values, a mean value of the pseudo random numbers being a predetermined fractional value,
   a three-modulus prescaler which has a set frequency division value, a first frequency division value obtained by decreasing the set frequency division value by N and a second frequency division value obtained by increasing the set frequency division value by N;
   a first counter which counts a first cycles of an output signal of the three-modulus prescaler and which outputs a fractional frequency division signal,
   a second counter which counts a second cycles of the output signal of the three-modulus prescaler which is smaller in number than the first cycles; and
   a control counter which counts cycles of the output signal of the three-modulus prescaler to a target count value which is an absolute numerical value of an output pseudo random number of the pseudo random numbers, in a period of time which is counted by the first counter and is not counted by the second counter, wherein the target count value is smaller in number than a value of the first cycles and an additional value of the first cycles to the target count value is smaller in number than the value of the first cycles,
   wherein the three-modulus prescaler outputs the first frequency division value when the output pseudo random number of the pseudo random numbers is a negative value and the second frequency division value when the output pseudo random number of the pseudo random numbers is a positive value, during a period of time until the control counter counts up the cycles to the target count value.

2. The fractional frequency divider PLL device according to claim 1,
   wherein the control counter counts the cycles to the target count value extracted from a numerical bit sequence specifying the absolute numerical value of the output pseudo random number, and
   wherein until the control counter counts up the cycles to the target count value, frequency division value of the three-modulus prescaler is set to the first frequency division value or the second frequency division value corresponding to a sign bit specifying a sign of the output pseudo random number.

3. The fractional frequency divider PLL device according to claim 2, wherein the control counter has number of bits constituting of the numerical bit sequence.

4. The fractional frequency divider PLL device according to claim 2, wherein the control counter starts count operation in response to completion of count operation by the second counter.

5. The fractional frequency divider PLL device according to claim 2, wherein the frequency division value of the three-modulus prescaler is set to the second frequency division value until the second counter counts up the second cycles.

6. The fractional frequency divider PLL device according to claim 5,
wherein the three-modulus prescaler has N=1.

7. The fractional frequency divider PLL device according to claim 1, wherein the output pseudo random number is a MASH type random number.

8. A method of controlling a fractional frequency divider PLL device by utilizing a ΣΔ modulation in which pseudo random numbers that are a 0 value, positive integer values, or negative integer values are generated, a mean value of the pseudo random numbers being a predetermined fractional value, comprising:
    outputting a signal with a frequency division value chosen from among a set frequency division value, a first frequency division value obtained by decreasing the set frequency division value by N and a second frequency division value obtained by increasing the set frequency division value by N,
    counting a first cycles of the signal with the frequency division value output by the outputting and outputting a fractional frequency division signal,
    counting a second cycles of the signal with the frequency division value output by the outputting which is smaller in number than the first cycles; and
    counting cycles of the signal with the frequency division value output by the outputting to a target count value which is an absolute numerical value of an output pseudo random number of the pseudo random numbers, in a period of time which is counted by the counting the first cycles and is not counted by the counting the second cycles, wherein the target count value is smaller in number than a value of the first cycles and an additional value of the first cycles to the target count value is smaller in number than the value of the first cycles,
    wherein the outputting the signal with the frequency division value comprises:
    outputting the first frequency division value when the output pseudo random number of the pseudo random numbers is a negative value during the counting cycles; and
    outputting the second frequency division value when the output pseudo random number of the pseudo random numbers is a positive value during the counting cycles.

9. The method of controlling the fractional frequency divider PLL device according to claim 8, wherein the counting cycles start in response to the completion of the counting the second cycles.

10. The method of controlling the fractional frequency divider PLL device according to claim 8, wherein during the counting the second cycles, the outputting the signal with the frequency division value chooses the second frequency division value.

11. The method of controlling the fractional frequency divider PLL device according to claim 10, wherein the outputting the signal with a frequency division value has N=1.

12. The method of controlling the fractional frequency divider PLL device according to claim 8, wherein the output pseudo random number is a MASH type random number.

* * * * *